United States Patent
Lee

(10) Patent No.: US 7,253,505 B2
(45) Date of Patent: Aug. 7, 2007

(54) IC SUBSTRATE WITH OVER VOLTAGE PROTECTION FUNCTION

(75) Inventor: Chun-Yuan Lee, Chutung (TW)

(73) Assignee: INPAQ Technology Co., Ltd., Chen, Miao Li Hsien (TW)

( * ) Notice: Subject to any disclaimer, the term of this patent is extended or adjusted under 35 U.S.C. 154(b) by 0 days.

(21) Appl. No.: 11/364,404

(22) Filed: Feb. 28, 2006

(65) Prior Publication Data

US 2006/0138612 A1 Jun. 29, 2006

Related U.S. Application Data

(62) Division of application No. 10/463,984, filed on Jun. 18, 2003, now Pat. No. 7,053,468.

(30) Foreign Application Priority Data

Jun. 19, 2002 (TW) .............................. 91113365 A

(51) Int. Cl.
*H01L 23/522* (2006.01)
*H01L 23/48* (2006.01)
*H01L 23/52* (2006.01)
*H01C 7/04* (2006.01)

(52) U.S. Cl. .............................. 257/668; 257/E23.174; 257/E23.021; 257/E23.024; 257/E23.062; 257/E23.067; 257/E23.069; 257/E23.079; 257/E23.289; 257/659; 257/700; 257/691; 257/698; 257/696; 257/684; 257/734; 257/737; 257/738; 257/701; 257/758; 257/796; 257/778

(58) Field of Classification Search ........ 257/E23.174, 257/E23.021, E23.024, E23.062, E23.067, 257/E23.069, E23.079, E23.189, 659, 668, 257/700–703, 691, 698, 696, 774, 684, 784, 257/734, 737
See application file for complete search history.

(56) References Cited

U.S. PATENT DOCUMENTS

| | | | |
|---|---|---|---|
| 3,648,364 | A | 3/1972 | Endo |
| 4,959,505 | A | 9/1990 | Ott |
| 4,993,142 | A | 2/1991 | Burke et al. |
| 5,831,510 | A | 11/1998 | Zhang et al. |
| 5,884,391 | A | 3/1999 | McGuire et al. |
| 6,013,358 | A | 1/2000 | Winnett et al. |
| 6,172,590 | B1 | 1/2001 | Shrier et al. |
| 6,223,423 | B1 | 5/2001 | Hogge |
| 6,242,997 | B1 | 6/2001 | Barrett et al. |
| 6,285,275 | B1 | 9/2001 | Chen et al. |
| 6,297,722 | B1 | 10/2001 | Yeh |
| 6,429,533 | B1 | 8/2002 | Li et al. |

(Continued)

FOREIGN PATENT DOCUMENTS

JP 9-260106 10/1997

*Primary Examiner*—Alexander Oscar Williams
(74) *Attorney, Agent, or Firm*—Senniger Powers

(57) ABSTRACT

The present invention relates to an IC substrate provided with over voltage protection functions and thus, a plurality of over voltage protection devices are provided on a single substrate to protect an IC chip directly. According to the present invention, there is no need to install protection devices at respective I/O ports on a printed circuit board to prevent the IC devices from damage by surge pulses. Therefore, the costs to design circuits are reduced, the limited space is efficiently utilized, and unit costs to install respective protection devices are lowered down.

5 Claims, 10 Drawing Sheets

U.S. PATENT DOCUMENTS

| | | |
|---|---|---|
| 6,556,123 B1 | 4/2003 | Iwao et al. |
| 6,573,567 B1 | 6/2003 | Nishizawa et al. |
| 6,806,553 B2* | 10/2004 | Yashima et al. ............ 257/532 |
| 6,844,564 B2 | 1/2005 | Tanaka et al. |
| 2001/0000658 A1 | 5/2001 | Barrett et al. |
| 2002/0072147 A1* | 6/2002 | Sayanagi et al. ........... 438/106 |
| 2002/0139578 A1* | 10/2002 | Alcoe et al. ................ 174/262 |
| 2004/0056277 A1 | 3/2004 | Kamezos |

* cited by examiner

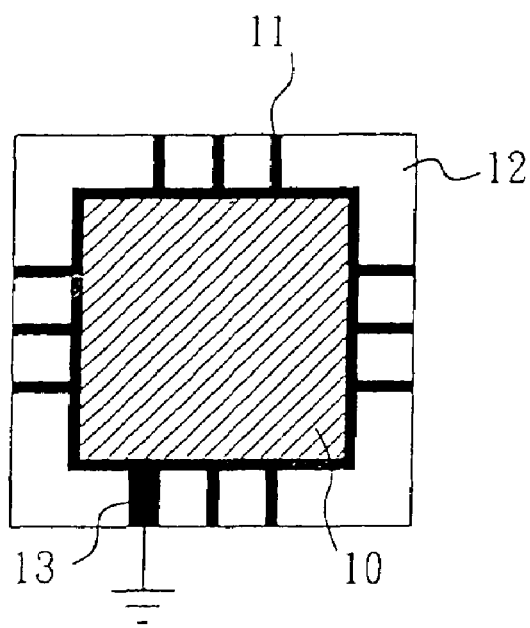
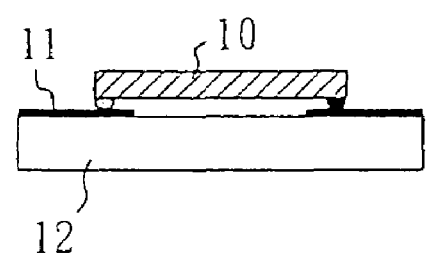
FIG. 1a
(PRIOR ART)
FIG. 1b
(PRIOR ART)

IC SUBSTRATE WITH OVER VOLTAGE PROTECTION FUNCTION

CROSS-REFERENCE TO RELATED APPLICATION

This application is a divisional of Ser. No. 10/463,984, now U.S. Pat. No. 7,053,468, filed Jun. 18, 2003, the entire contents of which are incorporated herein by reference.

FIELD OF THE INVENTION

The present invention relates to an IC substrate with over voltage protection functions, more particularly, to an IC substrate provided with a structure having multiple over voltage protection devices.

BACKGROUND OF THE INVENTION

A conventional over voltage protection device is installed near I/O ports on a printed circuit board to protect internal IC devices according to demands by each IC device. However, such design requires installing independent over voltage protection devices in accordance with requirements of respective circuits to prevent respective IC devices from being damaged by surge pulses.

Please refer to FIG. 1a, which is a top view of an IC device disposed on a conventional substrate. In FIG. 1a, there are a plurality of electrodes (11) and a grounding line (13) disposed on a substrate (12). Then, an IC device (10) is soldered to the plurality of electrodes and the grounding line. FIG. 1b is a sectional view of the IC device disposed on the conventional substrate. In FIG. 1b, we can understand the relationship among the constituent elements. Because such structure cannot provide over voltage protection functions, the IC device cannot withstand the energy of surge pulses, which result in irrecoverable damage to the IC device.

In order to protect the IC device, several over voltage protection devices are frequently proposed. However, those over voltage protection devices need to install individual protection devices on a printed circuit board according to actual demands after the IC device is manufactured and installed near the I/O ports on the printed circuit board. Therefore such a design has the disadvantages of high design costs, wastage of limited space, and incomplete protection for the IC device.

Therefore, there is a need to provide an IC substrate with over voltage protection functions. In this substrate, a plurality of over voltage protection devices is provided simultaneously to solve the problems of the prior arts that are unable to provide the over voltage protection or to eliminate the inconvenience in the prior arts of installing individual protection devices on a printed circuit board. The present invention provides an IC substrate with over voltage protection functions to eliminate such inconveniences.

SUMMARY OF INVENTION

An object of the present invention is to provide an IC substrate with over voltage protection functions and a method for manufacturing the same and thus, the IC device can be protected against the presence of surge pulses.

Another object of the present invention is to provide an IC substrate with over voltage protection functions and a method for manufacturing the same, wherein the grounding lines are disposed on a lower surface of a substrate and thus, the space is saved and the costs are reduced.

Still another object of the present invention is to provide a substrate having a plurality of over voltage protection devices, so that the design costs are reduced, the space is saved and the unit costs of installing a protection device on the IC circuits are reduced.

Another object is to provide an IC substrate with over voltage protection functions and a method for manufacturing the same, wherein the substrate can be designed by all kinds of IC packaging methods, such as DIP and SMD.

Another object of the present invention is to provide an IC substrate with over voltage protection functions and a method for manufacturing the same, wherein the protection circuits are installed after the IC is packaged.

In order to accomplish the above objects, the IC substrate comprises a substrate, and a grounding conductor layer for forming a grounding terminal. The grounding terminal is disposed on the lower surface of the substrate and extends to an upper surface of the substrate, thereby exposing one or more terminals on the upper surface of the substrate. One or more variable resistance material layers are disposed on exposed terminals of the grounding conductor layer. The grounding conductor layer terminals are electrically connected with the variable resistance material layers. A plurality of conductor layers form electrode terminals. Each conductor layer is disposed on the substrate and overlays each of the variable resistance material layers, so as to form a connection with each of the variable resistance material layers. In a practical application, the substrate is made of ceramic or PCB.

In order to understand the technical contents and features of the present invention with ease, the present invention is described by referring to the accompanying drawings.

BRIEF DESCRIPTION OF THE DRAWINGS

The present invention will be illustrated according to the following drawings, wherein:

FIG. 1a is a top view of an IC device disposed on a conventional substrate;

FIG. 1b is a sectional view of an IC device disposed on a conventional substrate;

DETAILED DESCRIPTION OF THE PREFERRED EMBODIMENTS

Figure 2A:
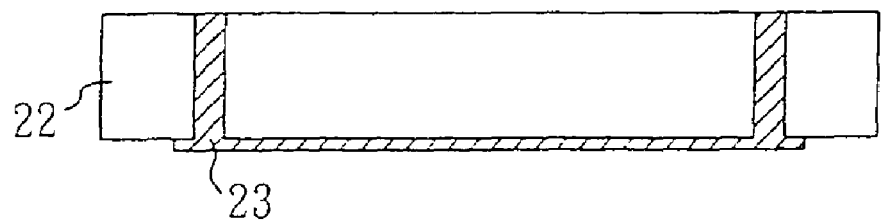
FIGS. 2a, 2b and 2c are sectional views of an IC substrate formed with over voltage protection functions according to an embodiment of the present invention.

The embodiments of the present invention are described with reference to the drawings. Identical elements in the drawings have the same reference numerals.

Figure 2B:
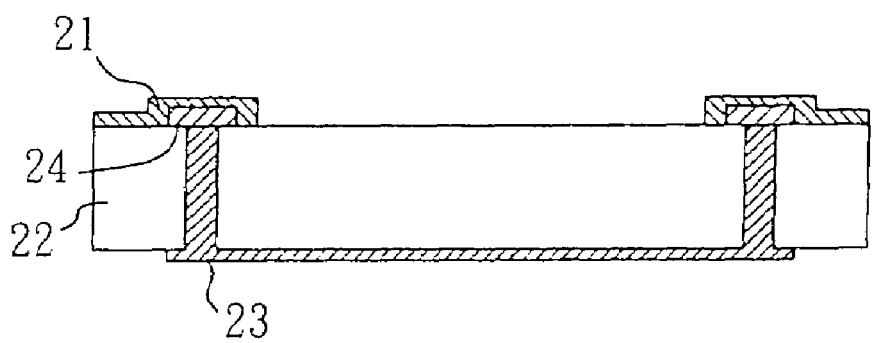
Figure 2C:
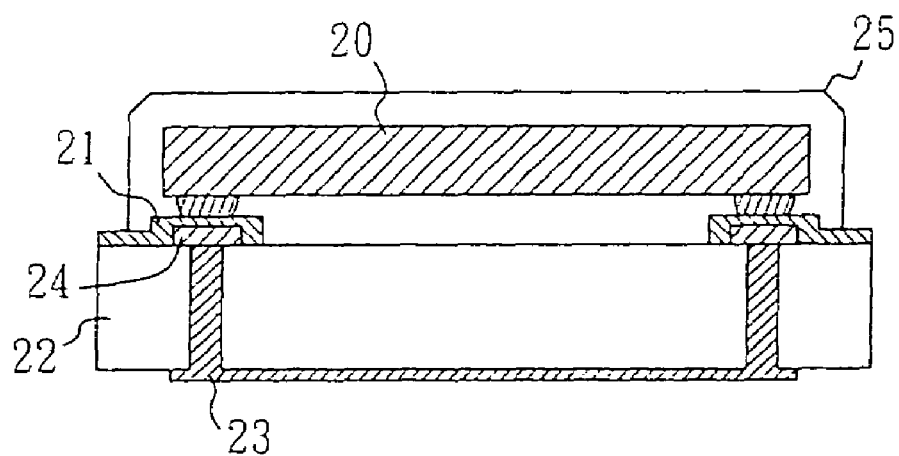
Figure 2D:
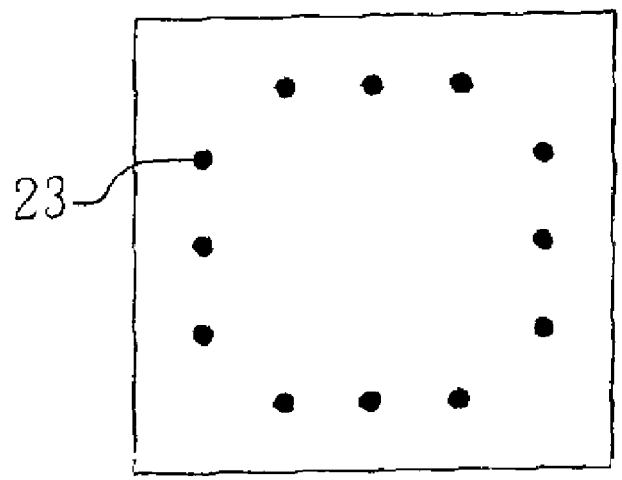
FIGS. 2d and 2e are top views of an IC substrate formed with over voltage protection functions according to the embodiment of the present invention.
Figure 2E:
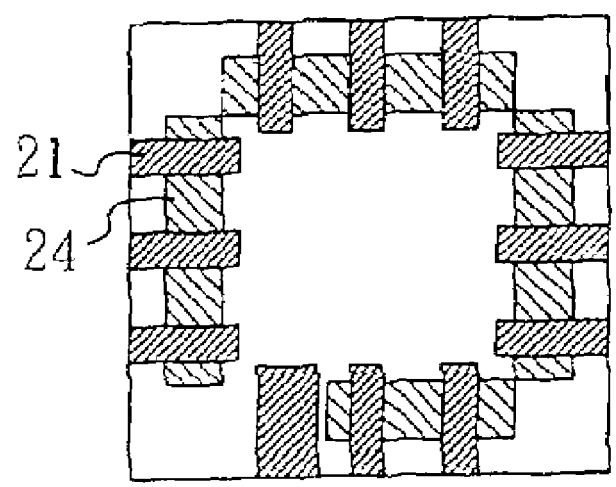

FIGS. 2a, 2b and 2c are sectional views of an IC substrate formed with over voltage protection functions according to an embodiment of the present invention. As shown in FIG. 2a, a first conductor layer is formed to be a grounding conductor layer (23) on a substrate (22). The first conductor layer is formed on a lower surface of the substrate and extends through the substrate to its upper surface. One or more terminals are formed on the upper surface of the substrate. As shown in FIG. 2b, one or more variable resistance material layers (24) are formed to overlay the terminals of the grounding conductor layer (23) so as to form connection with each of the variable resistance material layers. In addition, a plurality of second conductor layers (21) is formed to be upper electrodes. The second conductor layers overlay the variable resistance material layers (24) so as to form connections with each of the variable resistance material layers. FIG. 2c is a sectional view of an IC chip (20) disposed on the substrate. A chip (20) is connected with the upper electrodes (21) by soldering, and a protection layer (25) is added to the chip to guard against dust and moisture. FIG. 2d is a top view of the invention in FIG. 2a. FIG. 2e is a top view of the invention in FIG. 2b.

Figure 3:
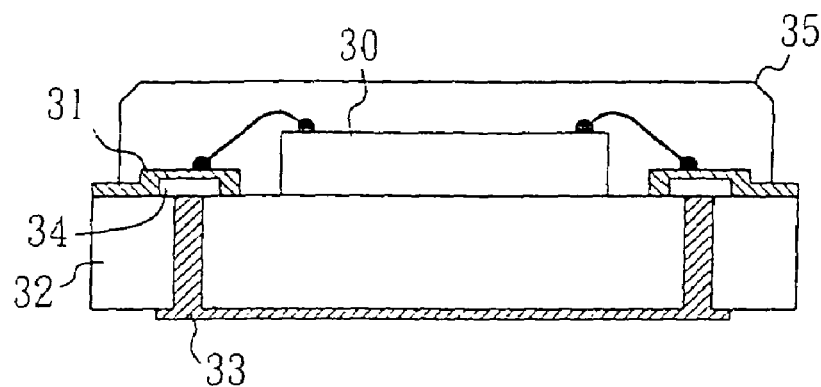
FIGS. 3, 4 and 5 are sectional views of an IC substrate formed with over voltage protection functions according to another embodiment of the present invention.

FIG. 3 shows another embodiment of connecting an IC chip with the upper electrodes by wire bonding.

Figure 4:
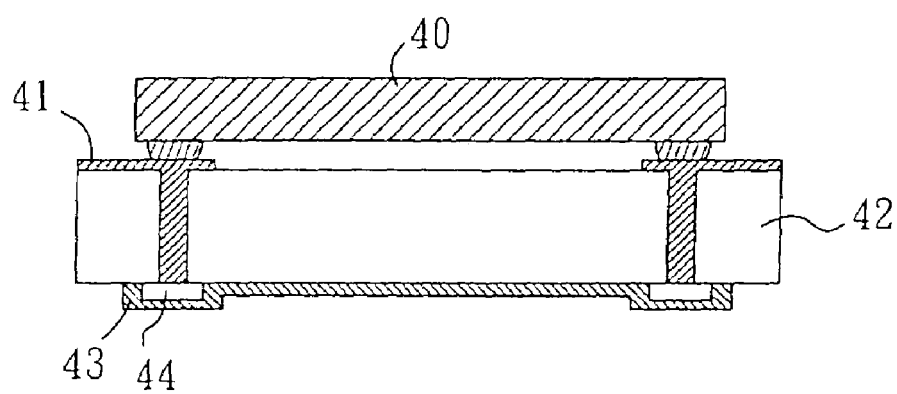

FIG. 4 is a sectional view of an IC substrate (42) with over voltage protection functions according to another embodiment of the present invention. As shown in FIG. 4, one or more variable resistance material layers (44) are formed on a substrate (42). The variable resistance material layers are disposed on the lower surface of the substrate. A grounding conductor layer (43) is formed to be a grounding terminal. The grounding terminal is disposed on the lower surface of the substrate and extends to overlay each of the variable resistance material layers. A plurality of conductor layers (41) is formed to be electrodes. The conductor layers are disposed on the upper surface of the substrate, and extend through the substrate to its lower surface so as to form connections with each of the variable resistance material layers.

Figure 5:
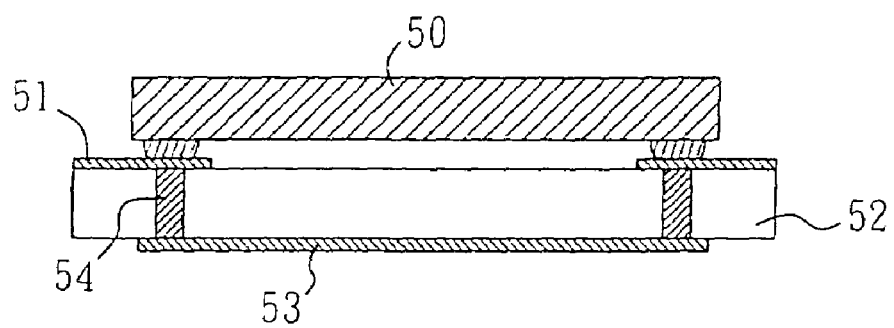

FIG. 5 is a sectional view of an IC substrate (52) with over voltage protection functions according to another embodiment of the present invention. As shown in FIG. 5, a grounding conductor layer (53) is formed on a substrate to be a grounding terminal. The grounding terminal is disposed on the lower surface of the substrate. One or more variable resistance material layers (54) are disposed through the substrate and are connected with the grounding conductor layer. A plurality of conductor layers (51) is formed to be electrode terminals. Each of the conductor layers is disposed on the upper surface of the substrate, and overlays each of the variable resistance material layers and is connected with them.

When a surge pulse occurs, the energy of the surge pulse will enter the electrode terminals (51) to propagate to the grounding terminal (53) through the variable resistance material layers (54). Due to the nature of the variable resistance materials and their structure, the energy of the surge pulse will be released evenly to the grounding lines and thus, the IC device (50) will not be damaged and the object of protecting the IC device is achieved.

Figure 6A:
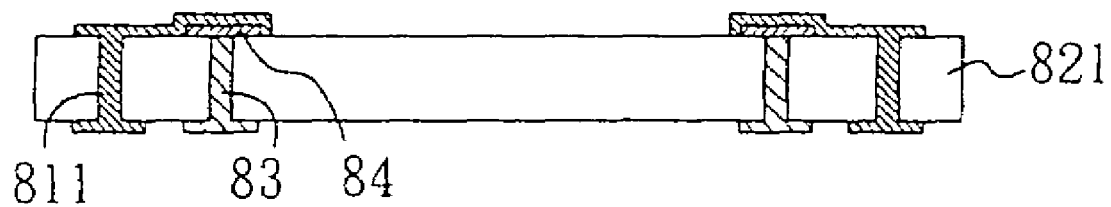
FIGS. 6a and 6b are top views of a multi-layer IC substrate formed with over voltage protection functions according to an embodiment of the present invention.
Figure 6B:
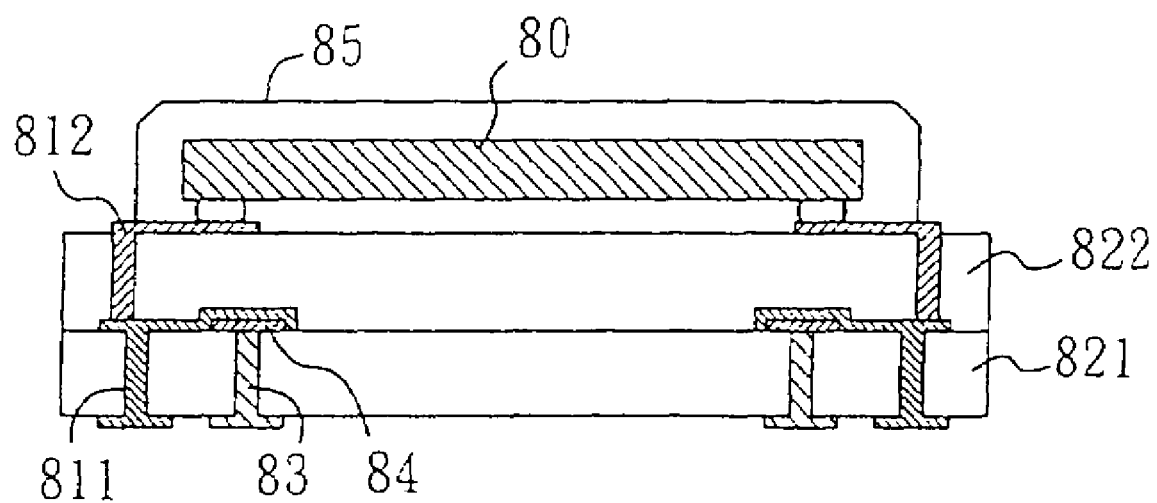

FIGS. 6a and 6b are top views of a multi-layer IC substrate formed with over voltage protection functions according to an embodiment of the present invention. As shown in FIG. 6a, one or more grounding conductor layers (83) are formed on a first substrate (821) to be grounding terminals, which extend to an upper surface of the first substrate and is disposed on the lower surface of the first substrate, thereby forming one or more terminals on the upper surface of the first substrate. One or more variable resistance material layers (84) are formed on the first substrate (821) and overlay the terminals of grounding conductor layers (83) appearing on the substrate and are connected with each of the grounding conductor layers. A plurality of first conductor layers (811) is formed on the upper surface of the first substrate (821). Each of the conductor layers (811) is disposed on the substrate and overlays each of the variable resistance material layers (84), so as to form an electrical connection with each of the variable resistance material layers. The plurality of first conductor layers (811) extends through the first substrate (821), and terminals of the first conductor layer (811) appear on the upper and lower surfaces of the first substrate (821).

As shown in FIG. 6b, a plurality of second conductor layers (812) is formed on a second substrate (822) to be electrode terminals. The plurality of second conductor layers extend through the second substrate (822), and terminals of the second conductor layer appear on the upper surface of the second substrate (822). The second substrate (822) is disposed on the upper surface of the first substrate (821), wherein the first conductor layers (811) are electrically connected with the second conductor layers (812). In FIG. 6b, an IC chip (80) is disposed on the second substrate (822), and a protection layer (85) is added to the second substrate.

Figure 7A:
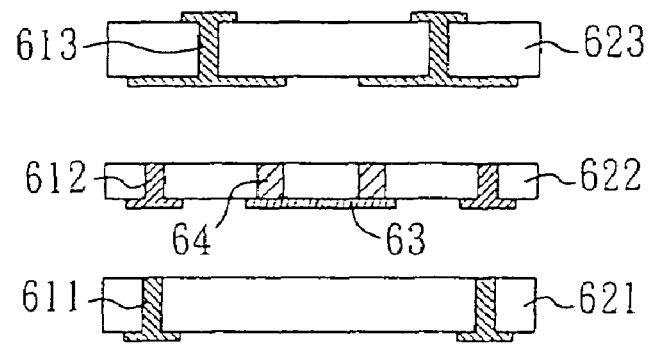
FIGS. 7a, 7b and 7c are sectional views of a multi-layer IC substrate formed with over voltage protection functions according to an embodiment of the present invention.
Figure 7B:
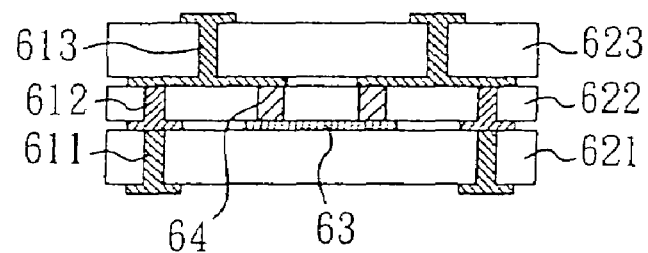
Figure 7C:
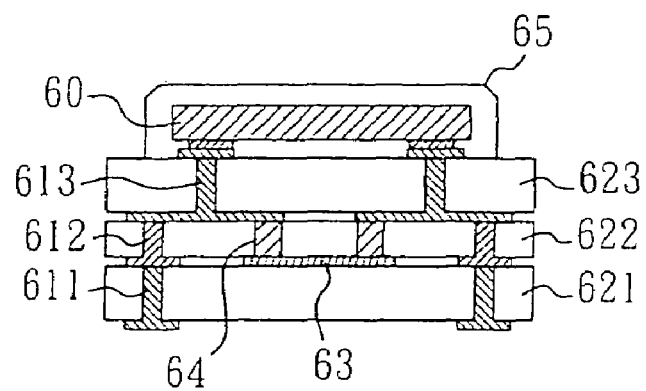

FIGS. 7a, 7b and 7c are sectional views of forming a multi-layer IC substrate formed with over voltage protection functions according to an embodiment of the present invention. As shown in FIG. 7a, a plurality of first conductor layers (611) is formed on a first substrate (621). Each of the conductor layers (611) is disposed on the first substrate, and terminals of the conductor layer appear on the upper surface and lower surface of the first substrate (621). A plurality of second conductor layers (612) is formed on a second substrate (622). Each of the conductor layers (612) is disposed on the second substrate (622), and terminals of the conductor layer (612) appear on the upper surface and lower surface of the second substrate (622). Holes are formed on the second substrate (622) and filled with one or more variable resistance material layers (64). The variable resistance material layer (64) is disposed through the second substrate (622). Terminals of the variable resistance material layers appear on the upper surface of the second substrate. A grounding conductor layer (63) is formed on the second substrate (622) to be a grounding terminal, which is disposed on the lower surface of the second substrate. A plurality of third conductor layers (613) is formed on a third substrate (623) to be electrode terminals. The plurality of third conductor layers is disposed through the third conductor layers appearing on the upper and lower surfaces of the third substrate.

As shown in FIG. 7b, the second substrate (622) overlays the first substrate (621). The lower portion of the variable resistance material layers (64) is connected with the grounding conductor layer (63). The terminals (612) on the lower surface of the second substrate are connected with the terminals (611) on the upper surface of the first substrate (621). The third substrate (623) overlays the second substrate (622). The third conductor layer (613) is connected with the variable resistance material layer (64) and the terminals (612) on the upper surface of the second conductor layer (612), respectively.

As shown in FIG. 7c, an IC chip (60) is disposed on the third substrate (623). The chip (60) is connected with the upper electrodes by soldering. A protection layer (65) is added to guard against dust and moisture.

Please note that the variable resistance material layers can be made of non-linear resistance materials.

FIGS. 8a, 8b, 8c, 8d and 8e are sectional views of a Ball Grid Array (BGA) IC package formed with over voltage protection functions according to an embodiment of the present invention. FIG. 8f is a top view of a BGA IC package formed with over voltage protection functions according to an embodiment of the present invention.

Figure 8A:
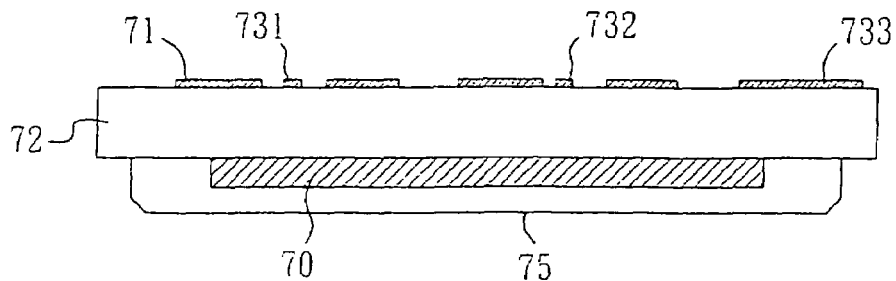
FIGS. 8a, 8b, 8c, 8d and 8e are sectional views of a BGA IC package formed with over voltage protection functions according to an embodiment of the present invention.
Figure 8B:
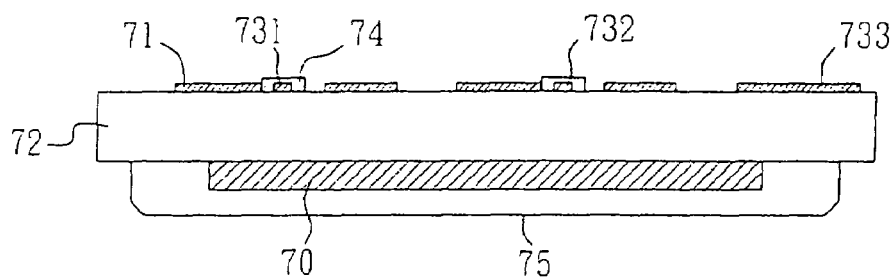
Figure 8C:
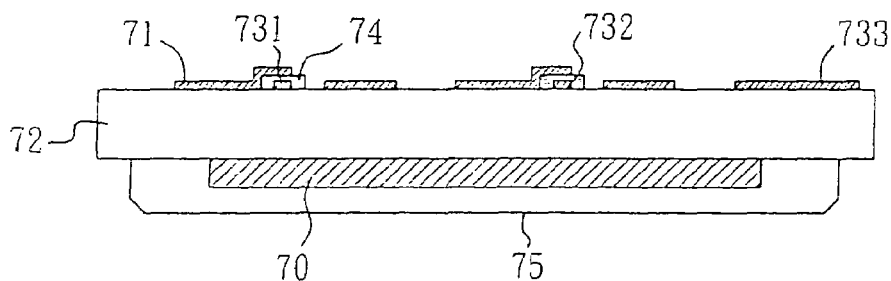
Figure 8D:
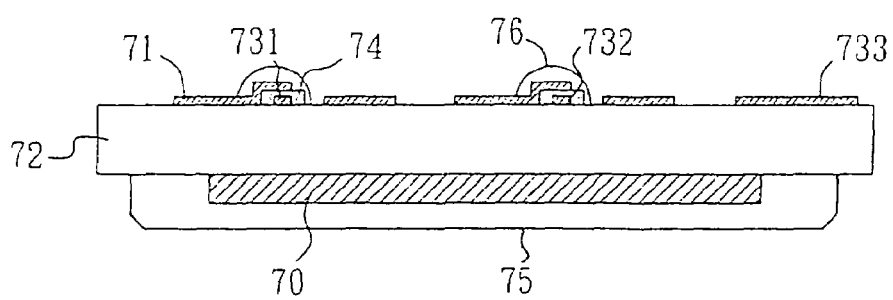
Figure 8E:
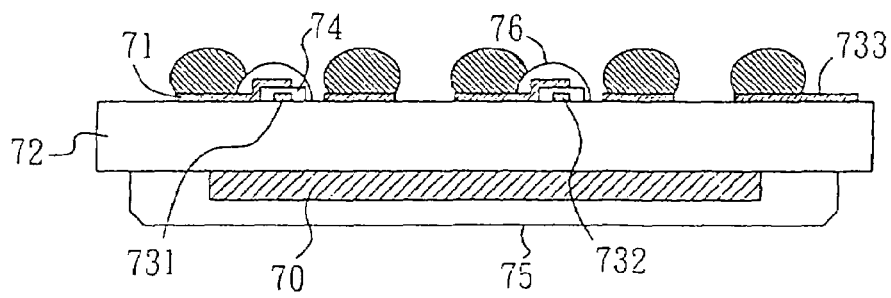
Figure 8F:
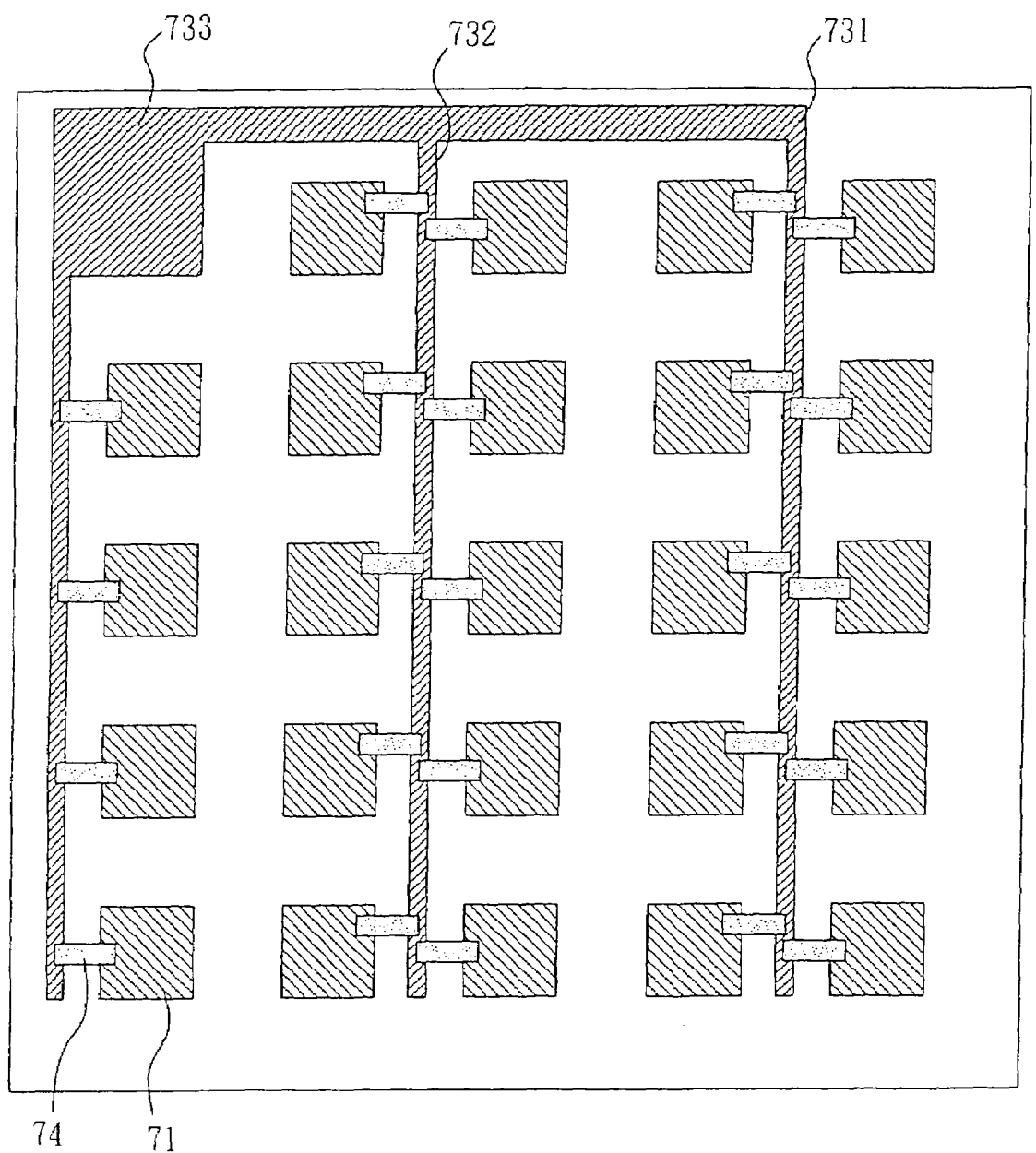
FIG. 8f is a top view of a BGA IC package formed with over voltage protection functions according to an embodiment of the present invention.

As shown in FIG. 8a, a plurality of grounding conductor layers (731, 732, 733) is formed on a BGA IC package to be grounding terminals. Each of the terminals is disposed on the surface of the BGA IC package. As shown in FIGS. 8b and 8f, one or more variable resistance material layers (74) are formed on the plurality of grounding conductor layers (731, 732). Each of the variable resistance material layers is disposed on the terminals of the grounding conductor layers (731, 732) and is connected with each of the grounding conductor layers. As shown in FIG. 8c, a plurality of variable resistance material layers (74) is connected with electrode terminals (71) and grounding conductor layers (731, 732, 733). As shown in FIG. 8d, a second protective layer (76) is disposed on the electrode terminals and the variable resistance materials layers. FIG. 8e is a sectional view of an embodiment of the present invention after solders are added on the electrode terminals and the grounding conductor layers.

Figure 9A:
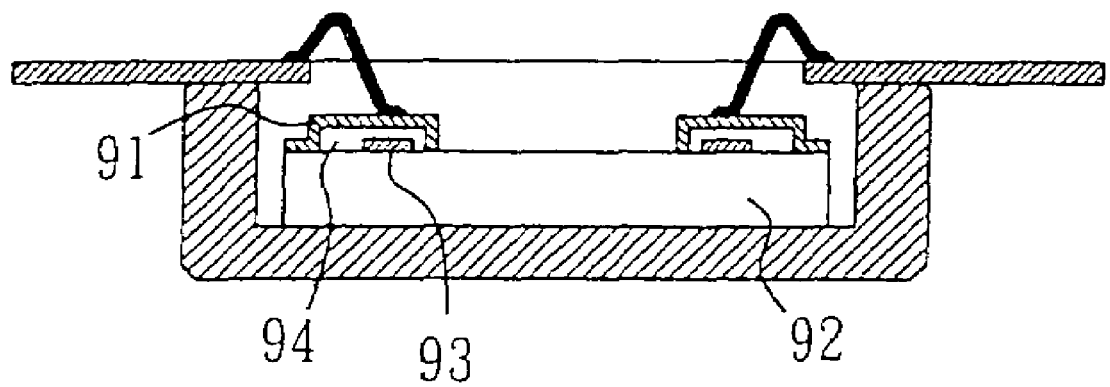
FIGS. 9a and 9b are sectional views of the IC substrate with over voltage protection functions according to an embodiment of the present invention.
Figure 9B:
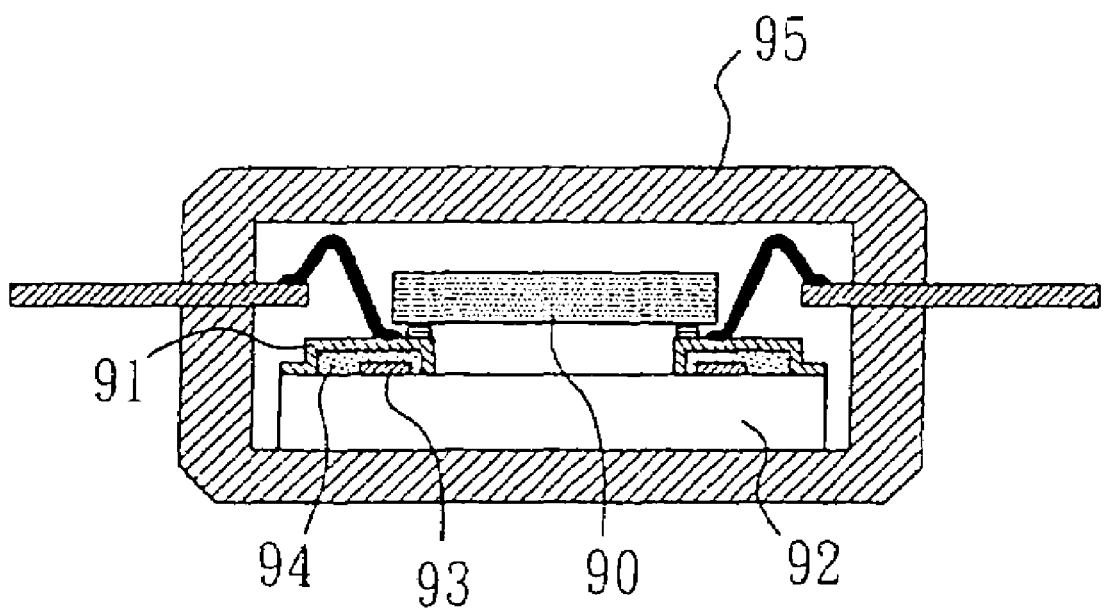

FIGS. 9a and 9b are sectional views of the IC substrate with over voltage protection functions according to an embodiment of the present invention.

FIGS. 10a, 10b, 10c, 10d, 10e and 10f are sectional views of an IC substrate formed with over voltage protection functions according to an embodiment of the present invention.

Figure 10A:
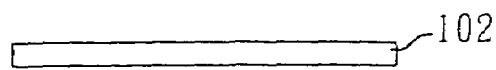
FIGS. 10a, 10b, 10c, 10d, 10e and 10f are sectional views of an IC substrate formed with over voltage protection functions according to an embodiment of the present invention.
Figure 10B:
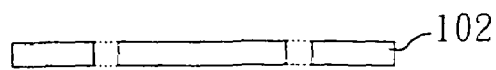
Figure 10C:
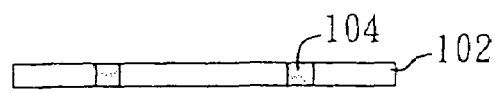
Figure 10D:
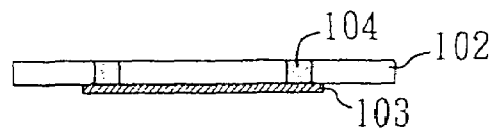
Figure 10E:
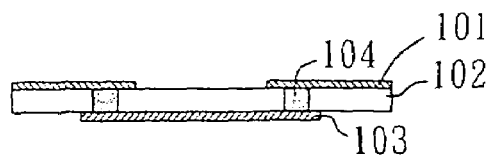
Figure 10F:
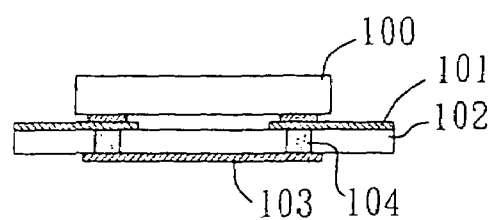

According to an embodiment of the present invention, a method for forming an IC substrate with over voltage protection functions comprises the following steps. As shown in FIGS. 10a and 10b, one or more desired holes are formed in the substrate (102) by lasering or punching. As shown in FIG. 10c, the holes are filled with variable resistance material layers (104). As shown in FIG. 10d, a lower electrode (103) is formed on the substrate. The lower electrode (103) overlays each of the variable resistance material layers (104) and is connected with the variable resistance material layers (104). As shown in FIG. 10e, a plurality of upper electrodes (101) is formed on the upper surface of the substrate (102). Said upper electrodes (101) overlay each of the variable resistance material layers (104) and are connected with the variable resistance material layers (104). Said upper electrodes and lower electrodes are formed by printing or metal foil pressing. FIG. 10f is a sectional view of an IC chip (100) disposed on the substrate (102).

Although the invention has been disclosed in terms of preferred embodiments, the disclosure is not intended to limit the invention. The invention still can be modified or varied by persons skilled in the art without departing from the scope and spirit of the invention which is determined by the claims below.

What is claimed is:

1. An IC substrate with over voltage protection functions, comprising:
   a first substrate;
   one or a plurality of the grounding conductor layers for forming a grounding terminal, said grounding terminal being disposed on a lower surface of the first substrate and extending to an upper surface of the first substrate, thereby one or a plurality of terminals is formed on the upper surface of the first substrate;
   one or more variable resistance material layers disposed on the terminals exposed on the grounding conductor layer and connected with each of the grounding layers;
   a plurality of first conductor layers disposed on the substrate and overlaying on each of the variable resistance material layers so as to be connected with each of variable resistance material layers, the plurality of the first conductor layers being disposed through the first substrate, thereby terminals of the first conductor layers is exposed on the upper and lower surfaces of the first substrate;
   a second substrate disposed on the upper surface of the first substrate; and
   a plurality of the second conductor layers for forming electrode terminals, which are disposed through the second substrate and connected with the first conductor layers on the first substrate, and a terminal of the second conductor layer being exposed on an upper surface of the second substrate.

2. The IC substrate with over voltage protection functions of claim 1, wherein the variable resistance material layers are non-linear resistance material layers.

3. The IC substrate with over voltage protection functions of claim 1, wherein the substrate are made of ceramic materials or polymer materials.

4. The IC substrate with over voltage protection functions of claim 1, wherein the electrode terminals are connected with a chip by soldering.

5. The IC substrate with over voltage protection functions of claim 1, further comprising a protection layer for reducing the influence from an outside environment.

* * * * *